United States Patent [19]

Nonaka

[11] 4,178,196

[45] Dec. 11, 1979

[54] METHOD FOR MANUFACTURING AN IMAGE PICKUP TUBE TARGET

[75] Inventor: Yasuhiko Nonaka, Mobara, Japan

[73] Assignee: Hitachi, Ltd., Japan

[21] Appl. No.: 908,286

[22] Filed: May 22, 1978

[30] Foreign Application Priority Data

Jul. 1, 1977 [JP] Japan ................................ 52-77916

[51] Int. Cl.[2] ..................... H01L 27/14; H01L 21/06

[52] U.S. Cl. ..................................... 148/174; 427/74; 427/76; 427/109; 427/248 B; 427/248 J; 427/255; 357/16; 357/59; 357/61; 148/175

[58] Field of Search ........... 427/76, 74, 248 B, 248 J, 427/255, 109; 357/16, 59, 61; 148/175, 174

[56] References Cited

U.S. PATENT DOCUMENTS

| | | | |
|---|---|---|---|
| 3,020,432 | 2/1962 | Nicholson | 427/76 |
| 3,020,442 | 2/1962 | Nicholson | 427/76 |
| 3,106,488 | 10/1963 | Lubszynski | 427/76 |
| 3,966,512 | 6/1976 | Nonaka | 427/76 |

*Primary Examiner*—Michael F. Esposito

*Attorney, Agent, or Firm*—Craig and Antonelli

[57] ABSTRACT

A method for manufacturing an image pickup tube target is disclosed, in which, in evaporating a porous $Sb_2S_3$ film in a low pressure insert gas, the amount of pre-evaporation of $Sb_2S_3$ is decreased as the number of times of repetitive use of an evaporation boat increases in which $Sb_2S_3$ is placed for evaporation, whereby an $Sb_2S_3$ film having a given porosity is formed.

1 Claim, 3 Drawing Figures

METHOD FOR MANUFACTURING AN IMAGE PICKUP TUBE TARGET

BACKGROUND OF THE INVENTION

The present invention relates to a method for manufacturing an image pickup tube target using a Se-As-Te amorphous semiconductor having a heterojunction.

In the past, an image pickup tube target using a photoconductive film has used $Sb_2S_3$ or PbO. Recently, there has been proposed a photoconductive target using Se-As-Te material which has an excellent spectral sensitivity characteristic and an excellent resolution and still has low lag characteristic and good dark current characteristic.

Since the Se-As-Te material has a very high resistivity, electron charges may be stored. In order to prevent such a phenomenon to improve a scanning characteristic of an electronic beam, it has been proposed to deposit a porous $Sb_2S_3$ film on the Se-As-Te photoconductor film on the side of an electron gun. However, as shown in Japanese Laid-Open Patent Application 52-26192, when the porosity of the $Sb_2S_3$ film is too low, cracks may occur in the film because of a difference between coefficients of thermal expansion of the $Sb_2S_3$ film and the Se-As-Te film as the contrast of the video image is reversed by high velocity scanning, and when the porosity of the $Sb_2S_3$ film is too high, the scanning characteristic of the electron beam is materially deteriorated and the decay lag time or build up lag time increases, or the lag characteristic (%) after 50 msec increases.

SUMMARY OF THE INVENTION

It is an object of the present invention to provide a method for manufacturing an image pickup tube target having a Se-As-Te photoconductive film coated with a porous thin $Sb_2S_3$ film, which method can avoid the drawbacks described above encountered in the conventional manufacturing method and can deposit the $Sb_2S_3$ film having a given porosity in a stable manner and with high reproducibility.

DETAILED DESCRIPTION OF THE PREFERRED EMBODIMENT

Figure 1:
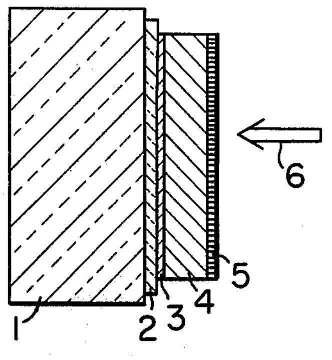
FIG. 1 shows a sectional view of an image pickup tube target having a Se-As-Te photoconductive film coated with an $Sb_2S_3$ thin film.

FIG. 1 shows a sectional view of an image pickup tube target having a Se-As-Te photoconductive film coated with a porous thin $Sb_2S_3$ film. In FIG. 1, numeral 1 denotes a transparent target substrate such as quartz or glass, numeral 2 denotes a transparent conductive film mainly consisting of tin oxide, numeral 3 denotes an N-type conductive film such as cerium oxide for presenting a blocking characteristic, numeral 4 denotes a P-type photoconductive film of Se-As-Te amorphous film having Te partially distributed therein, numeral 5 denotes a porous thin $Sb_2S_3$ film and numeral 6 denotes an electron beam. An interface between the conductive film 3 and the photoconductive film 4 forms a heterojunction.

The cerium oxide film having a thickness of 100 to 1000 Å is evaporated to form the N-type conductive film 3 on the substrate 1 coated with the transparent conductive film 2 while maintaining the substrate 1 in an vapor deposition apparatus at a vacuum of not higher than $3\times10^{-6}$ Torr, and then the Se-As-Te material is evaporated to a thickness of 3 to 8 μm to form the P-type photoconductive film 4. The vapor deposition is then stopped and an inert gas such as nitrogen or argon is introduced into the vapor deposition apparatus at a low pressure on the order of 0.1 Torr and $sb_2S_3$ is evaporated to a thickness of 1000 to 2000 Å to form the porous $Sb_2S_3$ film 5. In the prior art method, in evaporating the $Sb_2S_3$ porous film, the evaporation rate was controlled to a constant rate prior to the vapor deposition on the target as shown by a straight line m marked with X in FIG. 2, to predeposit a predetermined amount of $Sb_2S_3$ independently of the number of times of the repetitive use of the evaporation boat, and then the porous $Sb_2S_3$ film having the thickness of 1,000 to 2,000 Å was evaporated on the target P-type photoconductive film 4. The decay lag characteristic of the image pickup tube using the target manufactured in the prior art method described above and the frequency of occurrence of the crack in the photoconductive film considerably change from lot to lot of the evaporation, but when the results are plotted for each evaporation lot to the number of times of the repetitive use of the evaporation boat in evaporating the $Sb_2S_3$ film 5, a regularity is observed as shown in FIG. 3, in which a curve $n_1$ marked with X shows a decay lag characteristic (%) after 50 m sec of the image pickup tube in an ordinate with an abscissa representing the number of times of the use of the evaporation boat, and a curve $P_1$ marked with X shows a frequency of occurrence of cracks (%) in the ordinate with the abscissa representing the number of times of use of the evaporation boat. They show data for each evaporation lot for the target manufactured in the prior art method. It is common practice in the manufacture of the target to use $Sb_2S_3$ including Sb in excess to a stoichiometric amount. It is considered that there is a correlation between a change of boat due to the repetitive use of the evaporation boat and a change of composition of $Sb_2S_3$.

Based on the above results, according to the present invention, the amount of pre-evaporation of $Sb_2S_3$ which is previously deposited prior to the deposition of $Sb_2S_3$ on the target is gradually decreased as the number of times of the repetitive use of the evaporation boat increases.

Figure 2:
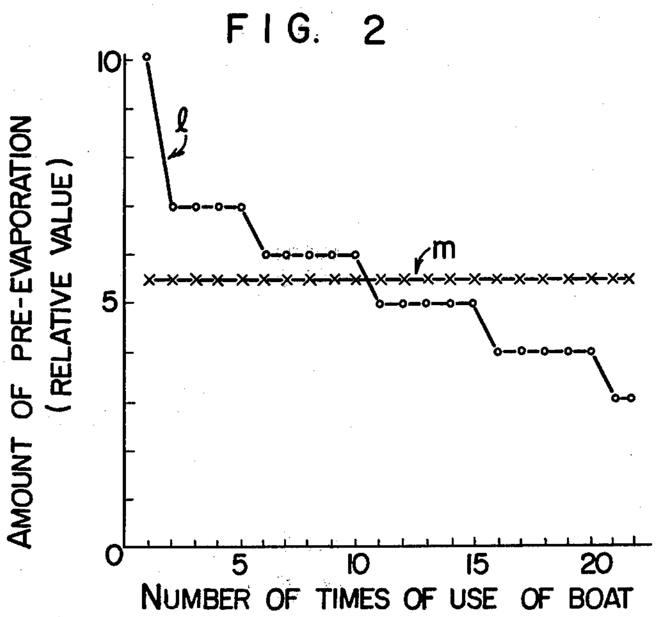
FIG. 2 shows relationship between the amount (relative value) of pre-evaporation of $Sb_2S_3$ and the number of times of repetitive use of a boat, for a prior art method and the present method.
Figure 3:
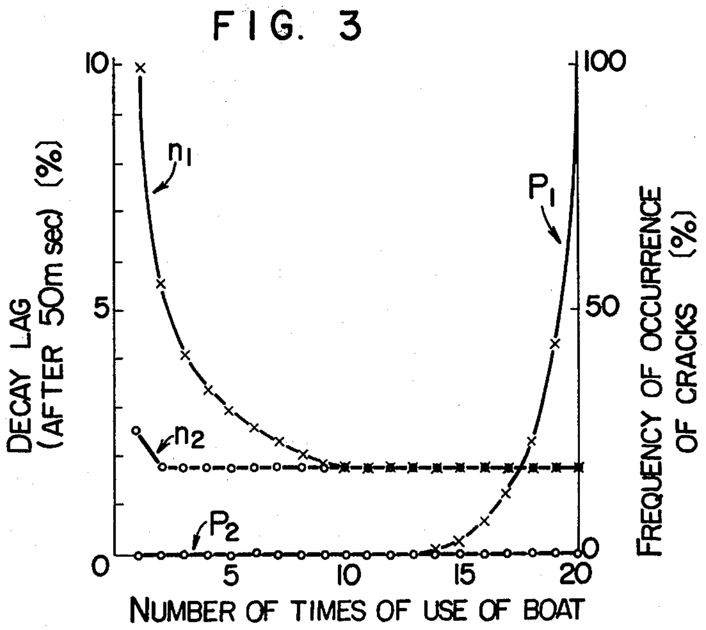
FIG. 3 shows relationship between a decay lag characteristic of image pickup tube for each lot of $Sb_2S_3$ evaporation and a frequency of the occurrence of cracks in the photoconductive film by thermal stress, and the number of times of repetitive use of the boat, for the prior art method and the present method.

Namely, in the manufacturing method of the present invention, the amount of pre-evaporation is decreased as the number of times of the use of the same evaporation boat (the number of times of charging of $Sb_2S_3$ into the boat for use in the evaporation apparatus) increases, as shown by a curve l marked with o in FIG. 2. At the beginning of the use of the boat, only the pre-evaporation is carried out or a sufficiently large amount of pre-evaporation is carried out. The frequency of occurrence of cracks in the photoconductive film manufactured by the present method and the decay lag characteristic of the image pickup tube using that target are shown relative to the number of times of the use of the boat, for each evaporation lot, respectively by a curve $P_2$ marked with o and a curve $n_2$ marked with o in FIG. 3. The decay lag characteristic is constant at about 2% after the second evaporation, and the frequency of occurrence of the cracks is zero.

As described hereinabove, according to the present invention, the image pickup tube target which has a low decay lag characteristic and in which no cracks occur in the film can be manufactured in a stable manner and with a high reproducibility.

What is claimed is:

1. A method for manufacturing an image pickup tube target having a transparent substrate, a transparent conductive film, an N-type conductive film a Se-As-Te P-type photoconductive film and a porous $Sb_2S_3$ film formed in sequence one on the other, in which, in evaporating said porous $Sb_2S_3$ film in a low pressure inert gas, the amount of pre-evaporation of $Sb_2S_3$ is decreased as the number of times of repetitive use of an evaporation boat increases in which $Sb_2S_3$ is placed for evaporation, whereby the $Sb_2S_3$ film having a given porosity is formed.

* * * * *